United States Patent
Stoupis et al.

(10) Patent No.: US 7,725,295 B2
(45) Date of Patent: *May 25, 2010

(54) CABLE FAULT DETECTION

(75) Inventors: James Stoupis, Durham, NC (US); Ajay C. Madwesh, Allentown, PA (US); David Lubkeman, Cary, NC (US); Mirrasoul Mousavi, Cary, NC (US)

(73) Assignee: ABB Research Ltd., Zurich (CH)

( * ) Notice: Subject to any disclaimer, the term of this patent is extended or adjusted under 35 U.S.C. 154(b) by 0 days.

This patent is subject to a terminal disclaimer.

(21) Appl. No.: 12/433,580

(22) Filed: Apr. 30, 2009

(65) Prior Publication Data

US 2009/0281740 A1    Nov. 12, 2009

Related U.S. Application Data (63) Continuation-in-part of application No. 11/555,429, filed on Nov. 1, 2006.

(51) Int. Cl.
*G01R 31/00* (2006.01)

(52) U.S. Cl. .............. 702/185; 702/59; 702/60; 702/62; 700/292; 700/293; 700/294; 361/64; 361/66; 361/68; 340/657; 340/661; 324/527

(58) Field of Classification Search .......... 702/59, 702/60, 185; 324/532, 527, 512, 536, 543, 324/522, 539; 361/100, 81
See application file for complete search history.

(56) References Cited

U.S. PATENT DOCUMENTS

| | | | | |
|---|---|---|---|---|
| 4,227,145 A | * | 10/1980 | Bonikowski et al. | 324/543 |
| 4,254,374 A | * | 3/1981 | Trihus | 324/539 |
| 4,446,420 A | * | 5/1984 | Drouet | 324/522 |
| 5,428,342 A | * | 6/1995 | Enoki et al. | 340/511 |
| 5,886,861 A | * | 3/1999 | Parry | 361/42 |
| 6,144,721 A | | 11/2000 | Stephens | |
| 6,754,597 B2 | * | 6/2004 | Bertsch et al. | 702/57 |
| 6,798,211 B1 | * | 9/2004 | Rockwell et al. | 324/527 |
| 6,822,457 B2 | * | 11/2004 | Borchert et al. | 324/512 |
| 6,868,357 B2 | * | 3/2005 | Furse | 702/108 |

(Continued)

FOREIGN PATENT DOCUMENTS

DE    3812433 A    * 10/1989

(Continued)

OTHER PUBLICATIONS

Bogdan Kasztenny and Christopher G. Jones, "Dectection of Incipient Faults in Underground Medium Voltage Cables", 61st Annual Conference of Protective Relay Engineers, Apr. 2008.

(Continued)

*Primary Examiner*—Carol S Tsai
(74) *Attorney, Agent, or Firm*—Paul R. Katterle (57) ABSTRACT

A cable fault detection component (168) receives input data indicative of a fault in an electrical power system. The component (168) analyzes the input data to determine if the fault is indicative of a temporary or self-clearing cable fault and generates corresponding output data (276). In one implementation, the cable fault detection component (168) is implemented as a software module which operates on a computer (105) of a substation intelligence system (104).

17 Claims, 4 Drawing Sheets

U.S. PATENT DOCUMENTS

| | | | |
|---|---|---|---|
| 7,176,589 B2 * | 2/2007 | Rouquette | 307/17 |
| 7,304,826 B2 * | 12/2007 | Yuan et al. | 361/19 |
| 7,472,026 B2 | 12/2008 | Premerlani et al. | |
| 2003/0085715 A1 * | 5/2003 | Lubkeman et al. | 324/509 |
| 2007/0093977 A1 * | 4/2007 | Yuan et al. | 702/58 |

FOREIGN PATENT DOCUMENTS

| | | | |
|---|---|---|---|
| EP | 1850109 A1 * | 10/2007 | |
| JP | 2001045666 A * | 2/2001 | |
| KR | PCT/US2007/022543 | 6/2009 | |

OTHER PUBLICATIONS

Mirrasoul J. Mousavi and Karen L. Butler-Purry, "Temporal analysis of power system measurements for condition assessment purposes", IEEE Power Engineering Society General Meeting, Jun. 2007, pp. 1-8.

C. J. Kim, "Identification of symptom parameters for failure anticipation by timed-event trend analysis", IEEE Power Engineering Review, vol. 20, No. 9, Sep. 2000, pp. 48-49.

C. J. Kim, Seung-Jae Lee and Sang-Hee Kang, "Evaluation of feeder monitoring parameters for incipient fault detection using Laplace trend statistic", IEEE Transactions on Industry Applications, vol. 40, No. 6, Nov.-Dec. 2004, pp. 1718-1724.

Kirama Kanoun and Jean-Claude Laprie, "Software reliability trend analyses from theoretical to practical considerations", IEEE Transactions on Software Engineering, vol. 20, No. 9, Sep. 1994, pp. 740-747.

Olivier Gaudoin, "Optimal properties of the Laplace Trend Test for software-reliability models", IEEE Transaction on Reliability, vol. 41, No. 4, Dec. 1992, pp. 525-532.

C. J. Kim, J. H. Shin, M. Yoo and G. W. Lee, "A Study on the Characterization of the Incipient Failure Behavior of Insulators in Power Distribution Line", IEEE Transactions on Power Delivery, vol. 14, No. 2, Apr. 1999, pp. 519-524.

W. E. Anderson, J. D. Ramboz and A. R. Ondrejka, "The detection of incipient faults in transmission cables using time domain reflectometry techniques: Technical challenges", IEEE Transactions on Power Apparatus and Systems, vol PAS-101, No. 7, Jul. 1982, pp. 1982-1934.

K. L. Butler, "An expert system based framework for an incipient failure detection and predictive maintenance system," in Proc. 1996 Intelligent System Application to Power Systems Conf., Jan. 1996, pp. 321-326.

S. M. Miri and A. Privette, "A survey of incipient fault detection and location techniques for extruded shielded power cables", presented at the 26th Annual Southeastern Symposium on System Theory, Athens, Oh, 1994, pp. 402-405.

H. E. Orton, "Diagnostic Testing of in-situ power cables: an overview", IEEE/PES Transmission and Distribution Conference and Exhibition 2002: Asia Pacific Conference, Yokohama, Japan, Oct. 2002, vol. 2, pp. 1420-1425.

R. Moghe, M. J. Mousavi, J. Stoupis, and McGowan, "Field investigation and analysis of incipient faults leading to a catastrophic failure in an underground distribution feeder", in Proc. 2009 Power Systems Conference and Exposition, Mar. 2009.

J. Cardoso and K. L. Butler, "Field studies of incipient behavior in damaged underground cable," in Proc. 60th Annu. American Power Conf., vol. 60-I, Chicago, IL, Apr. 14-16, 1998, pp. 522-526.

Rohit Moghe and Mirrasoul Mousavi,"Trend analysis Techniques for Incipient Fault Prediction," The 2009 IEEE PES General Meeting Advanced Program of Technical Sessions and Committee Meetings., Seattle, WA. Jul. 30, 2009.

L. A. Kojovic and C. W. Williams, "Sub-cycle dectection of incipient cable splice faults to prevent cable damage", in Proc. IEEE/PES Summer Meeting, Jul. 16-20, vol. 2, 2000, pp. 1175-1180.

* cited by examiner

CABLE FAULT DETECTION

CROSS-REFERENCE TO RELATED APPLICATION

This application is a continuation-in-part of U.S. patent application Ser. No. 11/555,429 filed on Nov. 1, 2006, which is hereby incorporated by reference in its entirety.

BACKGROUND OF THE INVENTION

The present application relates to fault detection in electrical power transmission and distribution systems. It finds particular application to the detection and analysis of faults in underground cables and other conducting medium used in the underground and overhead power distribution feeders.

Underground and overhead feeders are a key component in the transmission and distribution of electrical power. Unfortunately, however, these circuit components can be prone to shorts or otherwise abnormally low impedance connections between two or more phases or between one or more phases and ground. These faults can be caused by a number of factors, including human error (e.g., accidentally cutting or striking a cable), climatologic conditions (e.g., precipitation, seismic activity, or lightning strikes), animal activity, and failure or degradation of the insulation used in the feeder equipment. Moreover, such faults can lead to power outages, which are inconvenient for the affected customers and which can be expensive for the electric utility involved.

One category of fault is that of self-clearing faults, particularly in cable systems. While self-clearing faults can have any number of root causes, they typically have insufficient duration to trip the relevant protective device. In practice, the duration of most self-clearing faults is typically less than two (2) to three (3) cycles of the power system frequency, and in many cases less than one (1) cycle.

One mechanism which can generate self-clearing cable faults is a temporary breakdown in the insulation between cable phases or between a cable phase and ground. Such faults are often caused or exacerbated by moisture at a cable splice or joint, and are typically characterized by an elevated fault current having a duration of about one-quarter to one-half cycle (i.e., roughly four (4) to eight (8) milliseconds (ms) in a sixty Hertz (60 Hz) system). The onset of the fault current usually occurs at or near a voltage peak. As the situation deteriorates, the frequency and severity of these faults tend to worsen with time, culminating in an eventual cable failure and a resultant power outage.

As a consequence, a fault detection apparatus has been incorporated in a protective relay platform which can be used as an intelligent electronic device (IED). See Kojovic, et al., *Sub-Cycle Overcurrent Protection for Self-Clearing Faults Due to Insulation Breakdown* (1999); U.S. Pat. No. 6,198,401 to Newton, et al., Detection of Sub-Cycle, Self-Clearing Faults, issued Mar. 6, 2001. More particularly, and as more fully described in the references, the apparatus samples the cable current signal as it occurs. Contemporaneously with detecting a current signal which exceeds a threshold value, the apparatus confirms that the circuit breaker did not operate and also evaluates succeeding current samples (again, contemporaneously with their occurrence) to determine whether duration of the fault is less than one (1) cycle. If these conditions are satisfied, the device increments a fault counter. If the number and/or frequency of such faults occurrences exceeds a certain setting, the apparatus initiates an alarm, signalization, and/or a trip. In an alternate implementation, the apparatus also determines whether the fault occurred near a voltage peak.

However, the fault detection apparatus is provided at the level of the protective relay with a fixed implementation. One consequence of this relay-centric architecture is that the apparatus is relatively poorly integrated with the substation automation (SA), distribution automation (DA), feeder automation (FA), or other automation system. Moreover, the apparatus requires the use of a specialized hardware platform which must be closely coupled to the protective relay, and the detection techniques have been relatively unsophisticated and prone to noise and outliers.

SUMMARY OF THE INVENTION

In accordance with one aspect of the present invention, a method is provided for analyzing an anomaly in a cable carrying AC power. In accordance with the present invention, an anomaly with regard to the AC power in the cable is detected. Upon detecting the anomaly, data concerning characteristics of the AC power is recorded for a predetermined period of time. The data is transmitted to an analysis location. At the analysis location, the data is analyzed to determine whether the anomaly is a cable fault.

Those skilled in the art will appreciate still other aspects of the present invention upon reading and understanding the attached figures and description.

BRIEF DESCRIPTION OF THE DRAWINGS

The present invention is illustrated by way of example and not limitation in the figures of the accompanying drawings, in which like references indicate similar elements and in which.

DETAILED DESCRIPTION OF ILLUSTRATIVE EMBODIMENTS

Figure 1:
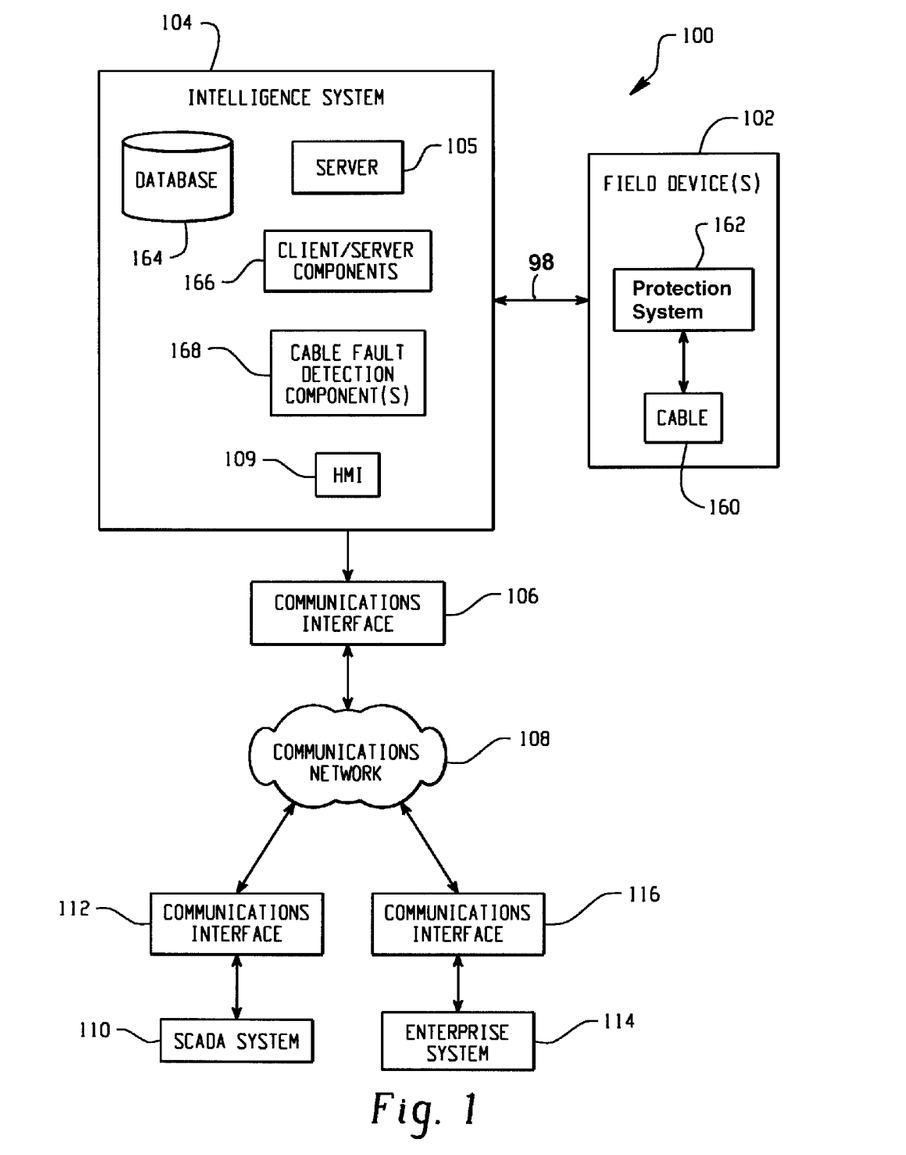
FIG. 1 depicts components of an electrical power distribution system.

With reference to FIG. 1, a substation 100 includes a plurality of field devices 102, a substation intelligence system 104 and a communication interface 106. The field devices 102 include transformers, capacitors, circuit breakers, intelligent electronic devices (IEDs) and other equipment and assets as are typically encountered in the substation environment. In the present example, the field devices 102 include one or more cables 160 such as transmission or feeder cables and associated protection systems 162.

The field devices 102 are operatively connected to the substation intelligence system 104 by a communication link 98, which may be a physical hardwired link, a cellular link, a modem or telephone line link, an Internet link or any other wireless or wide area or shared local area network link. Depending on the architecture of a given system, the intelligence system 104 may function as one or more of a substation automation system, a feeder automation system, or a distribution automation system. As illustrated, the substation intelligence system 104 includes one or more servers or other computers 105, a database 164, one or more client server components 166 and cable fault detection components 168, and an optional human machine interface (HMI) 109.

The communication interface 106 connects the substation intelligence system 104 to a wide area network (WAN), the internet, or other communications network(s) 108.

A supervisory control and data acquisition (SCADA) system 110 connects to the communications network 108 via suitable communications interface(s) 112. The SCADA system 110 is typically located remotely from the substation 100 and provides supervisory control functions for a plurality of substations 100 and/or other components of the power generation and distribution system.

The substation intelligence system 104 may also be connected to one or more enterprise computer systems such as data warehouses, data marts, planning systems, geographic information systems (GIS), or centralized maintenance management systems (CMMS) 114, which are likewise connected to the communications network 108 through communication interfaces 116.

As noted above, the cables 160 may include one or more transmission or feeder cables. Transmission cables are typically used to transmit high-voltage electricity from a generation source or substation to another substation in the electric power system. Feeder cables are typically used to provide an electrical connection between the output of a substation and the input of downstream circuits. Feeder cables which leave the substation are sometimes termed substation exit cables. It should be noted, however, that the cables 160 are not necessarily located within the physical boundaries of the substation 100 and may in fact be located some distance from the substation. Depending on siting and other considerations, some or all of the cable 160 may be underground cables.

A protection system 162 typically includes one or more protective relays and associated circuit breakers or reclosers. The protective relays are advantageously implemented as IED-based devices which, among other functions, monitor the voltage, current, and other relevant parameters of their associated cables 160, for example to detect various fault conditions, such as those caused by current, voltage, and/or frequency disturbances and which may or may not be caused by a cable fault.

Figure 3:
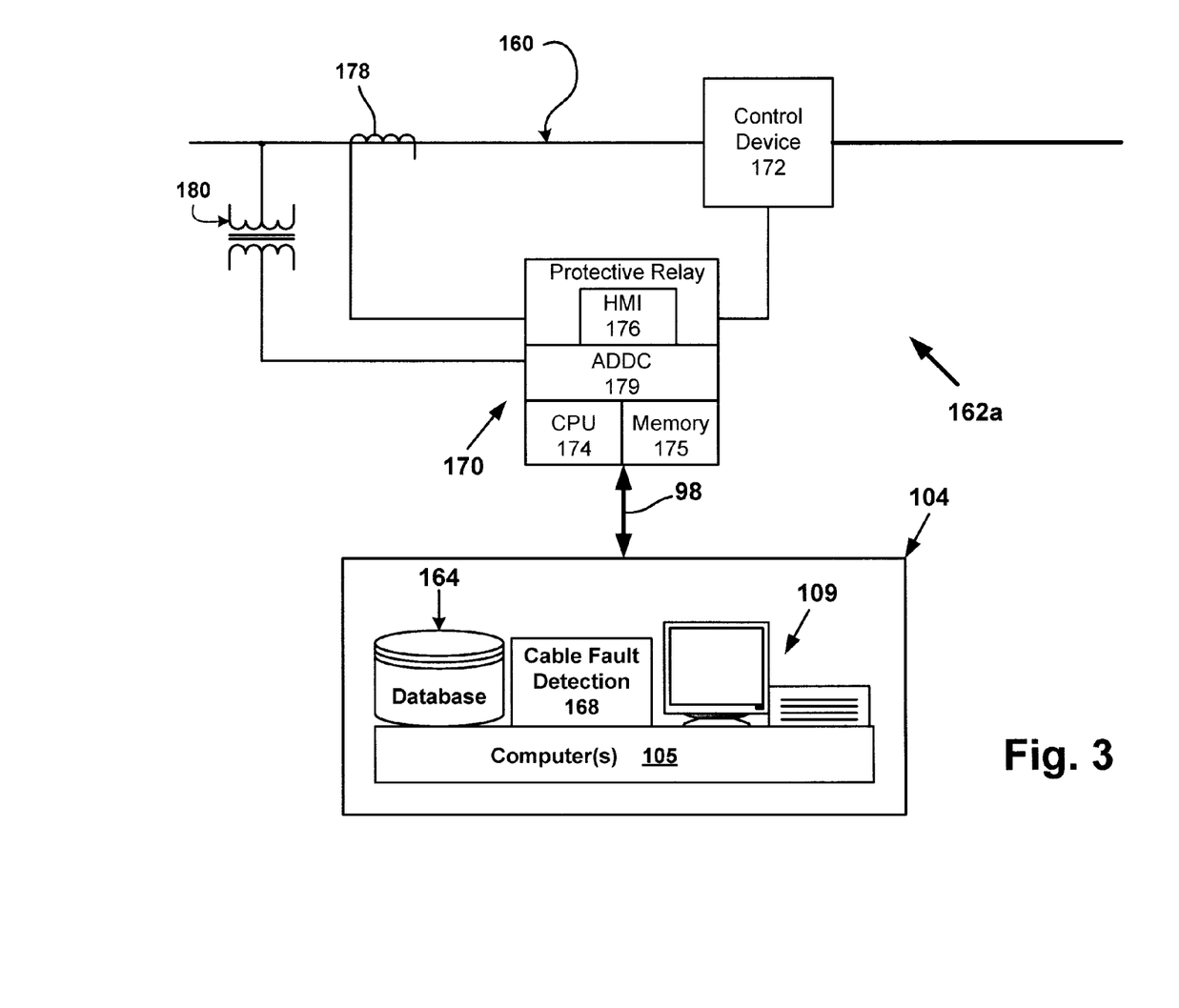
FIG. 3 depicts a protection system.

With particular reference to FIG. 3, there is shown a protection system 162a that may be located remotely (e.g. more than about a quarter mile) from the substation intelligence system 104. The protection system 162a comprises a protective relay 170 and an associated control device 172, such as a recloser or a circuit breaker. The protective relay 170 is an IED and includes a microprocessor (CPU) 174, memory 175 and a human machine interface (HMI) 176 which may include a display screen and a user input device, such as a key pad. The protective relay 170 is connected to current transformers 178 and voltage transformers 180 that measure currents and voltages in the cables 160, respectively. In addition, the protective relay 170 is connected to and provides control signals to the control device 172. The protective relay 170 is also connected to the substation intelligence system 104 through the communication link 98. The protective relay 170 has a plurality of instantaneous, definite-time delay and inverse-time delay overcurrent elements (phase, neutral, ground/sensitive ground and negative sequence). An anomaly detection and data capture (ADDC) program 179 is stored in memory 175 and is executed by the microprocessor 174. The ADDC program 179 receives user input through the HMI 176.

The ADDC program 179 monitors the currents and voltages in the cables 160 measured by the current transformers 178 and the voltage transformers 180, respectively. The ADDC program 179 also monitors the operation of the control device 172 and may monitor information received by the protective relay 170 from other field devices, including other current and voltage transformers and other protective relays. The ADDC program 179 is operable to detect faults or anomalies based on user selectable criteria that may be input into the ADDC program 179 through the HMI 176. In one embodiment of the present invention, the ADDC program 179 is operable to detect three different types of anomalies: overcurrent bursts, voltage deviations, and overcurrent element trips.

The ADDC program 179 detects overcurrent "bursts" that last less than a programmable time threshold setting (in milliseconds or cycles). For example, a user may set the threshold to be about one cycle (about 16 milliseconds). The ADDC program 179 may detect an overcurrent burst using a selected overcurrent protection element pickup of the protective relay 170, which itself has programmable settings. A user may select a particular overcurrent protection element through the HMI 176. For example, the ADDC program 179 may select an instantaneous ground time overcurrent protection element of the protective relay 170 for use in detecting an overcurrent burst. When such an overcurrent protection element is used, the threshold is set to a programmable percentage (e.g. 50%) of the selected overcurrent protection element pickup setting.

The ADDC program 179 detects voltage deviations greater than a programmable percentage threshold (e.g., 10%) of the nominal voltage setting that lasts longer than a programmable time threshold setting (in cycles). The percentage threshold and the time threshold may be set by a user through the HMI 176.

The ADDC program 179 detects any trip of any of one or more of the overcurrent protection elements.

Upon detecting an anomaly, such as an overcurrent burst, the ADDC program 179 captures digital fault record (DFR) data such as voltage, current, and other oscillographic data for a programmable collection period of time and sets a DFR flag indicating the occurrence of an anomaly. Typically, the ADDC program 179 takes voltage and/or current samples at a rate of 32 or more samples per cycle (about 16 milliseconds). The DFR data is formatted for transmission in the known common format for transient data exchange (COMTRADE) or other suitable file format. Depending on the nature and severity of the anomaly, the protective relay 170 may also trip the associated control device 172. The collection period during which DFR data is collected is set by a user through the HMI 176. The collection period may, by way of example, be greater than one cycle. For example, the collection period may be five, ten or fifteen cycles, or some other period.

With ongoing reference to FIG. 1, the client/server components 166 are advantageously implemented as software or firmware modules which are stored in a memory or other computer readable storage medium accessible to the computer 105. Execution of the components 166 is typically driven by either a timer (timed polling) or trigger-based (interrupting) mechanism so as to operate substantially in real time. Thus, for example, a client/server component 166 may from time-to-time poll a particular protection system 162 to obtain information relating to its status. Where the protection system 162 has set a DFR flag, the client/sever component 166 obtains the DFR data from the protective device 162 and generates an alarm or fault log in which the DFR data is stored at an appropriate location in the database 166, again in the COMTRADE or other suitable format. In the case of a trigger-based implementation, receipt of a DFR flag from a protection system or device triggers acquisition of the DFR data and generation of the fault log.

With still further reference to FIG. 1, the cable fault detection component 168 is likewise implemented as a software or firmware module which is stored in a memory or other computer readable storage medium accessible to the computer 105. The component 168 is also executed by the computer 105 on a polled, triggered, or other suitable basis. As will be described in further detail below, the cable fault detection component 168 analyzes the DFR and/or other relevant input data from the protective relay 170 and other protective relays to detect signature associated with cable faults. Upon detecting such a signature, the component 168 generates one or more outputs indicative of the fault for storage in the database 164.

The HMI 109, which may be implemented in a software layer or otherwise in software which is distinct from that of the various components 166, 168, provides desired operator interface functionality, for example to allow a user to interact with the various modules 166, 168, the database 164, or other components of the substation intelligence system 104. In one implementation, the HMI 109 is implemented as software or other computer readable instructions which implement a graphical user interface (GUI) on a suitable computer. User interfaces implemented in connection with the SCADA system 110 or the enterprise system 114, if any, may also allow a user to mine the data from one or more sources or otherwise provide desired HMI functionality.

Figure 2:
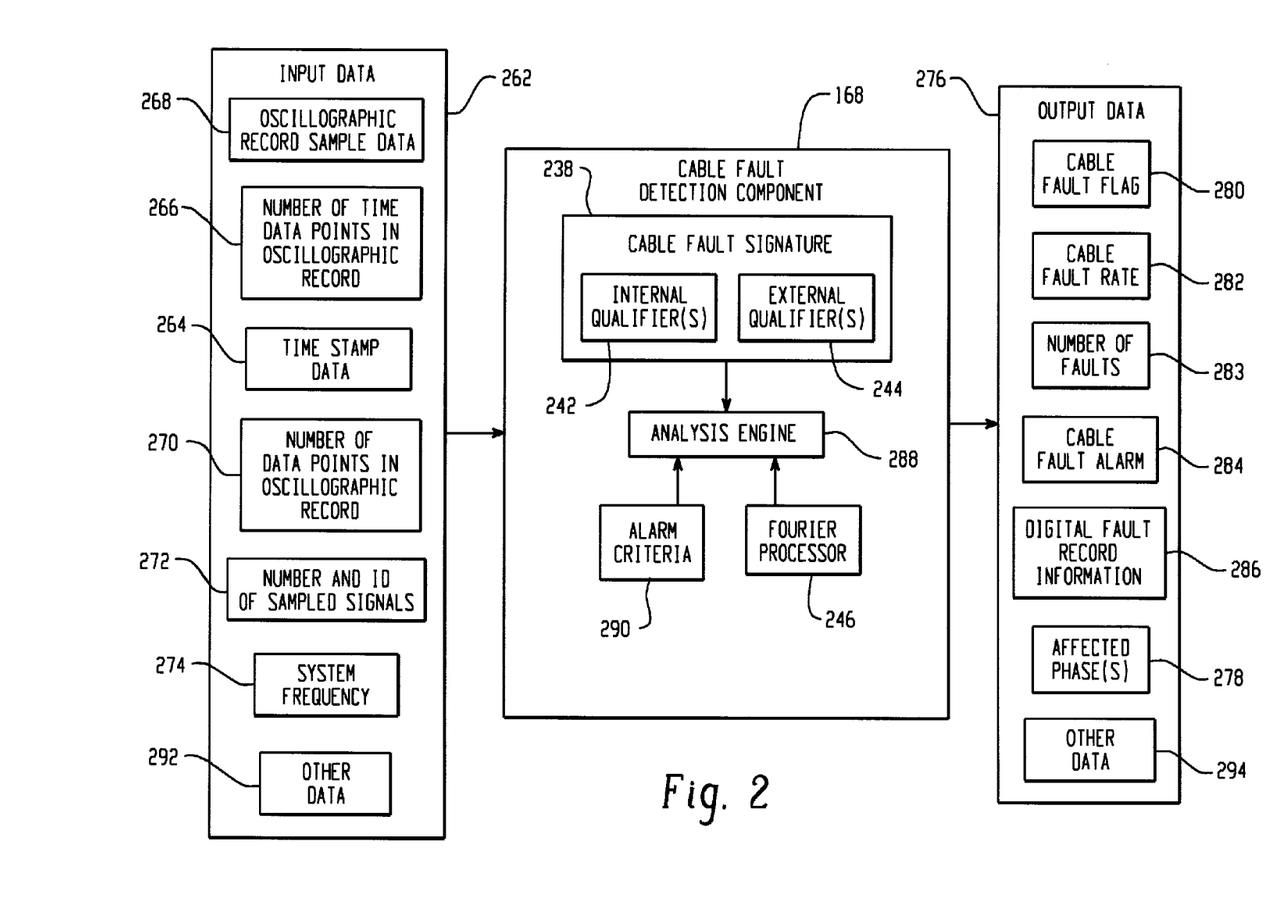
FIG. 2 depicts a substation intelligence system.

A functional block diagram depicting an exemplary cable fault detection component 168 in relation to its input 262 and output 276 data is shown in FIG. 2. The input data 262 includes oscillographic record data 268 such as time and sample data vectors, the number of sampled data points in the oscillographic record 266, time stamp data 264 such as the date and time at which the record was acquired, the number and identification of the sampled signals 272 (e.g., the number and identification of the sampled phase or phases), the system frequency 274, and other relevant data 292. The input data 262 may, by way of example, come from the protective relay 170, as well as other protective devices.

As illustrated, the detection component 168 includes an analysis engine 288 which operates in conjunction with a Fourier processor 246, cable fault signature criteria 238, and alarm criteria 290.

The Fourier transform processor 246, which is again advantageously implemented using suitable computer readable instructions, performs a discrete Fourier transform (DFT) of the voltage and/or current samples in the oscillographic record 268. In one implementation, the DFT is calculated over sample windows or time periods, each of which has a duration of a half (½) cycle of the system frequency or greater. Sample windows are typically separated by an interval of a quarter (¼) cycle, although other intervals are contemplated. As will be appreciated, performing a DFT of the time varying cable current samples generates frequency domain data indicative of the frequency component(s) of the cable current during a particular sampling window. The frequency domain data may include a peak at the power system frequency, the magnitude of which is indicative of the fundamental cable current during the period covered by the DFT.

The cable fault signature 238 includes internal power system qualifiers 242 and optional external qualifiers 244 which are indicative of a cable fault. In the exemplary case of a cable fault signature 238 associated with a self-clearing fault resulting from a temporary insulation breakdown at a cable splice or joint, the internal qualifiers 242 include a threshold cable current value, a threshold fault duration, and a fault onset criterion, although additional or different qualifiers may also be considered. For example, the cable fault signature 238 may be a current that exceeds the threshold cable current value for less than the threshold fault duration and begins at or near a voltage peak. Again, in the case of a temporary joint insulation breakdown, the external qualifiers 244 may include meteorological data such as precipitation, humidity, and/or ambient temperature. For example, the cable fault signature 238 may require that appreciable precipitation be detected at the substation 100.

The alarm criteria 290 include those criteria which are used to signal an alarm condition. In the case of a signature 238 associated with a temporary insulation breakdown, the alarm criteria may include a fault rate or frequency and/or a number of faults, although additional or different criteria are also contemplated. Note that one or more of the cable fault signature 238 and alarm 290 criteria may be adjustable, for example by the user via a GUI implemented on the HMI 109 or otherwise.

The analysis engine 288 evaluates the input data 262 to determine whether the fault satisfies the cable fault signature criteria 238. Again in the exemplary case of a cable fault caused by a temporary insulation breakdown, the analysis engine 288 evaluates the Fourier transformed current signal to determine whether the magnitude of the fundamental cable current exceeds the threshold value so as to comprise an overcurrent event. The analysis engine 288 also determines whether the duration of the overcurrent event is less than the threshold fault duration and whether the onset of the overcurrent event occurred at or near a voltage peak. In an implementation which includes external qualifier(s) 244, the analysis engine 288 also evaluates the relevant other input data 292, for example to determine whether the relative humidity exceeds a desired value. Where the component 168 includes alarm criteria 290, the analysis engine also determines whether the desired alarm criteria have been satisfied, for example to determine whether the rate or frequency of the cable faults exceeds the specified fault rate.

The cable fault detection component 168 uses the results of the evaluation to generate output data 276 such as one or more of a cable fault detected signal or flag 280, a cable fault rate or frequency 282, the number of cable faults 283, a cable fault alarm signal or flag 284, digital fault record data 286 such as the magnitude and duration of the fault, the phase or phase(s) affected by the fault 278, or other data 294. The output data is advantageously stored as one or more points in the substation intelligence system database 164 together with a suitable time stamp.

Various alternatives and extensions are also contemplated. For example, the detection component 168 may, alternatively or additionally, use other operational or non-operational data 262 as inputs to the cable fault analysis, with the cable fault signature criteria 238 selected accordingly. In one such implementation, the sampled voltage waveform may also be considered, for example to determine whether a period of increased current is accompanied by a corresponding dip in the sampled voltage.

If, as another example, heating caused by relatively higher values of cable current is expected to contribute to a cable fault, the average current values may be considered as appropriate. As still another example, other ambient or meteorological data such as lightning strikes, seismic activity, or the like may also be considered.

The detection component 168 may also calculate a probability or likelihood that a particular cable fault results from a particular fault mechanism, for example by assigning relative weights to the various signature criteria 238. The detection component 168 may include or otherwise access an internal or external database containing empirically or heuristically derived cable fault signatures 238 indicative of various cable fault mechanisms. In such a case, the cable fault output signal or flag 280 may also indicate the most likely fault mechanism or mechanisms. Separate outputs or flags may also be provided.

The detection component 168 may be utilized in intelligence systems 104 such as those described in commonly-owned U.S. patent application Ser. No. 11/555,393 by Stoupis, et al., and entitled Electrical Substation Monitoring and Diagnostics, which application was filed on Nov. 1, 2006 and is expressly incorporated by reference in its entirety herein.

As noted above, the detection component 168 advantageously operates on data having the COMTRADE or other desired format. Thus, the detection component 168 may be executed on a computer or process or an embedded system other than the server computer. For example, the detection component may be executed on a computer associated with the SCADA system 110 or the enterprise system 114, or otherwise on another suitable general purpose or dedicated processor which has access to the desired input data 262 over the communication network 118. Some or all of the component 168 may also be implemented in digital and/or analog hardware.

Various alternative Fourier transform algorithms are also contemplated. According to one such alternative, the discrete Fourier transform may be implemented using a suitable fast Fourier transform (FFT) algorithm. While the above discussion has focused on an analysis engine 288 which operates on frequency domain data, other analysis engines are contemplated. Thus, for example, the analysis engine 288 may perform one or more of time-domain based, rule-based, neural network, expert system, analytical, or other suitable analyses.

Figure 4:
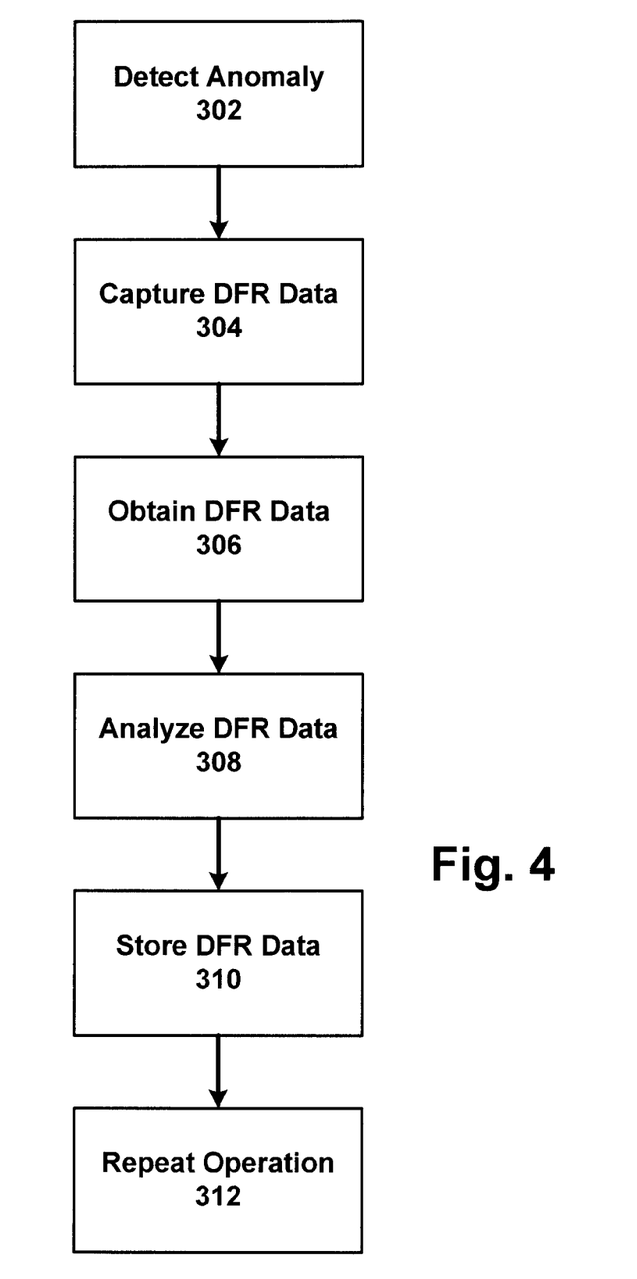
FIG. 4 depicts a flow chart of a cable fault detection operation.

A cable fault detection operation performed by the protective relay 170 and the substation intelligence system 104 will now be described in relation to FIG. 4. The ADDC program 179 of the protective relay 170 detects an anomaly at step 302. At step 304, the ADDC program 179 captures DFR data (in the COMTRADE or other suitable format) and sets the DFR flag indicating the occurrence of the anomaly.

The DFR data is obtained at step 306. Thus, for example, the DFR data is obtained by the intelligence system 104 and stored in the database 164 for use by the detection component 168. Alternately, the input data 262 is obtained directly by the detection component 168.

The DFR and other relevant input data (collectively input data 262) is analyzed at step 308. As described above, for example, the Fourier transform processor 246 performs a discrete Fourier transform (DFT) of the voltage and/or current samples in the input 262. The analysis engine 288 then evaluates the Fourier transformed current samples to determine if a cable fault has occurred. For example, the analysis engine 288 may determine whether the magnitude of the cable current exceeds a threshold value so as to comprise an overcurrent event and, if so, whether the duration of the overcurrent event is less than a threshold fault duration. The analysis engine 288 may also determine whether the overcurrent event occurred at or near a voltage peak. Depending on the results of the analysis, output data 276 such as one or more of a cable fault detection signal, cable fault number or rate, cable fault alarm, or cable fault mechanism output is generated.

At step 310, the output data 276 is stored in the database 164 or other desired location.

At step 312, the process is repeated, for example on a substantially real time basis during the operation of the power system.

Of course, modifications and alterations will occur to others upon reading and understanding the preceding description. It is intended that the invention be construed as including all such modifications and alterations insofar as they come within the scope of the appended claims or the equivalents thereof.

What is claimed is:

1. A method of analyzing an anomaly in a cable carrying AC power, the method comprising:
    detecting an anomaly with regard to the AC power in the cable;
    upon detecting the anomaly, recording data concerning characteristics of the AC power for a predetermined period of time, the data comprising oscillographic data indicative of a time varying signal of cable current;
    transmitting the data to an analysis location; and
    at the analysis location, analyzing the data to determine whether the anomaly is a cable fault, the analyzing comprising:
        performing a Fourier transform of the data; and
        using the Fourier transformed data to determine whether the anomaly is a cable fault; and
        wherein the Fourier transformed data comprises domain data indicative of a frequency component of the cable current, wherein the frequency domain data includes a peak at the AC power frequency and wherein a magnitude of the peak is indicative of the fundamental cable current.

2. The method of claim 1, wherein the anomaly is an overcurrent burst.

3. The method of claim 2, wherein the predetermined period of time is greater than one cycle of the AC power frequency.

4. The method of claim 1, further comprising receiving a value for the predetermined period of time from a user through a human machine interface.

5. The method of claim 1, wherein the step of detecting the anomaly is performed at a location remote from the analysis location.

6. The method of claim 1, wherein the step of detecting the anomaly is performed by a protective relay.

7. The method of claim 6, wherein the anomaly is an overcurrent burst and the step of detecting the anomaly is performed by an overcurrent protection element of the protective relay.

8. The method of claim 7, wherein the overcurrent protection element is an instantaneous ground time overcurrent protection element.

9. The method of claim 6, wherein the anomaly is a voltage deviation.

10. A method of analyzing an anomaly in a cable carrying AC power, the method comprising:
    detecting an anomaly with regard to the AC power in the cable;
    upon detecting the anomaly, recording data concerning characteristics of the AC power for a predetermined period of time;
    transmitting the data to an analysis location; and
    at the analysis location, analyzing the data to determine whether the anomaly is a cable fault, the analyzing comprising:
        performing a Fourier transform of the data, the Fourier transformed data comprising data representative of cable current; and
        using the Fourier transformed data to determine whether the anomaly is a cable fault, comprising:

determining whether the cable current exceeds a predetermined threshold value so as to comprise an overcurrent event; and if the cable current exceeds the predetermined threshold value, determining whether a duration of the overcurrent event is less than a threshold fault duration.

11. The method of claim 10, wherein the step of using the Fourier transformed data further comprises determining whether the overcurrent event began at or near a voltage peak.

12. The method of claim 11, wherein the anomaly is determined to be a cable fault if predetermined criteria is met, the predetermined criteria comprising: the cable current exceeding the predetermined threshold value so as to comprise an overcurrent event, the overcurrent event beginning at or near a voltage peak, and the overcurrent event having a duration that is less than the threshold fault duration.

13. The method of claim 12, wherein the predetermined criteria further comprises the detection of precipitation.

14. The method of claim 10, wherein the step of detecting the anomaly is performed by a protective relay.

15. The method of claim 14, wherein the protective relay comprises a plurality of overcurrent protection elements that are selectable by a user through a human machine interface to perform the detection of the anomaly, and wherein the method further comprises receiving a selection of a first one of the overcurrent protection elements to perform the detection of the anomaly.

16. The method of claim 15, wherein the first one of the overcurrent protection elements is an instantaneous ground time overcurrent protection element.

17. The method of claim 14, wherein the anomaly is a trip of an overcurrent protection element of the protective relay.

* * * * *